(12) United States Patent
Woo et al.

(10) Patent No.: US 7,465,625 B2
(45) Date of Patent: Dec. 16, 2008

(54) FLASH MEMORY CELL HAVING REDUCED FLOATING GATE TO FLOATING GATE COUPLING

(76) Inventors: Been-jon K. Woo, 20675 Woodward Ct., Saratoga, CA (US) 95070; Yudong Kim, 191 Muir Ave., Santa Clara, CA (US) 95051; Albert Fazio, 19900 Douglass La., Saratoga, CA (US) 95070

( * ) Notice: Subject to any disclaimer, the term of this patent is extended or adjusted under 35 U.S.C. 154(b) by 100 days.

(21) Appl. No.: 11/582,881

(22) Filed: Oct. 17, 2006

(65) Prior Publication Data

US 2007/0037350 A1 Feb. 15, 2007

Related U.S. Application Data

(62) Division of application No. 11/095,330, filed on Mar. 30, 2005, now Pat. No. 7,348,618.

(51) Int. Cl.
*H01L 21/8234* (2006.01)
*H01L 21/8244* (2006.01)

(52) U.S. Cl. .................... 438/238; 438/381; 438/257; 438/692; 257/E21.17; 257/E21.006; 257/E21.165; 257/E21.278; 257/E21.293; 257/E21.304; 257/E21.645

(58) Field of Classification Search .................. 438/238, 438/381, 257, 263, 264, 430, 583, 651, 664, 438/684, 680, 692, 954
See application file for complete search history.

(56) References Cited

U.S. PATENT DOCUMENTS

| | | | | |
|---|---|---|---|---|
| 5,278,103 A | * | 1/1994 | Mallon et al. | 438/632 |
| 5,717,635 A | * | 2/1998 | Akatsu | 365/185.05 |
| 5,991,204 A | * | 11/1999 | Chang | 365/185.29 |
| 6,025,260 A | * | 2/2000 | Lien et al. | 438/619 |
| 6,043,530 A | * | 3/2000 | Chang | 257/320 |
| 6,101,131 A | * | 8/2000 | Chang | 365/185.33 |
| 6,125,060 A | * | 9/2000 | Chang | 365/185.29 |
| 6,165,879 A | * | 12/2000 | Lee et al. | 438/586 |

(Continued)

OTHER PUBLICATIONS

Office Action from U.S. Appl. No. 11/095,330 mailed Nov. 9, 2006, 6 pages.

(Continued)

*Primary Examiner*—David Nhu
(74) *Attorney, Agent, or Firm*—Blakely, Sokoloff, Taylor & Zafman LLP (57) ABSTRACT

According to an embodiment of the invention, a flash memory cell includes a first gate stack and a second gate stack having a film deposited across the gap between the first and second gate stacks so that the film creates a void between the first and second gate stacks. Dielectric materials may be used to reduce conductivity between the two stacks. A dielectric material that is resistant to conductivity has a low dielectric constant (k). The lowest-k dielectric material is air, which has a dielectric constant of approximately 1. By creating a void between the two gate stacks, the least conductive material (air) is left filling the space between the gate stacks, and the likelihood of parasitic coupling of two adjacent floating gates is substantially reduced.

10 Claims, 10 Drawing Sheets

U.S. PATENT DOCUMENTS

| | | | |
|---|---|---|---|
| 6,580,120 B2 * | 6/2003 | Haspeslagh | 257/315 |
| 6,740,549 B1 * | 5/2004 | Chen et al. | 438/197 |
| 6,744,675 B1 * | 6/2004 | Zheng et al. | 365/185.28 |
| 6,888,753 B2 * | 5/2005 | Kakoschke et al. | 365/185.11 |
| 6,995,423 B2 * | 2/2006 | Zheng et al. | 257/316 |
| 7,084,015 B2 * | 8/2006 | Nguyen | 438/142 |

OTHER PUBLICATIONS

Office Action from U.S. Appl. No. 11/095,330 mailed Mar. 27, 2007, 7 pages.

Office Action from U.S. Appl. No. 11/095,330 mailed Aug. 1, 2007, 7 pgs.

* cited by examiner

FLASH MEMORY CELL HAVING REDUCED FLOATING GATE TO FLOATING GATE COUPLING

RELATED APPLICATIONS

This application is a divisional application of U.S. application Ser. No. 11/095,330, filed Mar. 30, 2005, now U.S. Pat. No. 7,348,618, issued Mar. 25, 2008.

FIELD OF THE INVENTION

The invention generally relates to electronic memories, and specifically to a flash memory cell with reduced coupling between floating gates.

BACKGROUND

Flash memory is a type of electronically Erasable Programmable Read-Only Memory (EEPROM). An EEPROM is a memory that can be erased by applying a signal across the memory cell array. Flash memory, unlike EEPROM memory, can be erased in discrete blocks. Flash memory is useful as non-volatile memory for computer systems, digital cameras, portable storage, etc. A flash memory array typically includes numerous individual cells that comprise transistors including two gates: a floating gate and a control gate. The control gate of an individual cell can be activated by propagating a signal along the appropriate bit line and word line, which reprograms the cell.

Figure 1A:
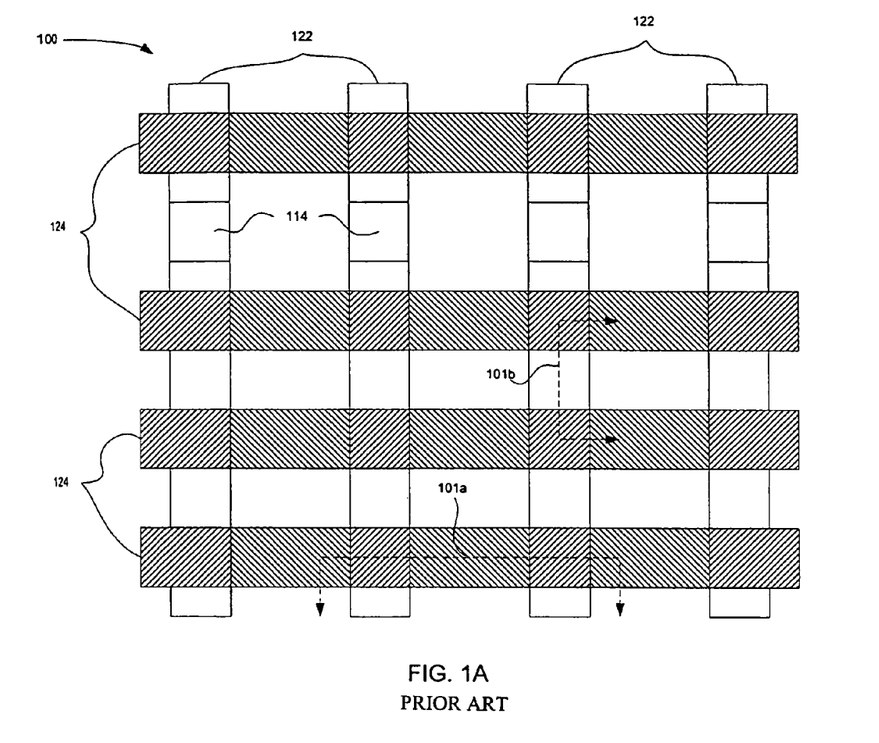
FIGS. 1A-1C illustrate a virtual ground (VG) erasable tunnel oxide (ETOX) flash memory cell array.
Figure 1B:
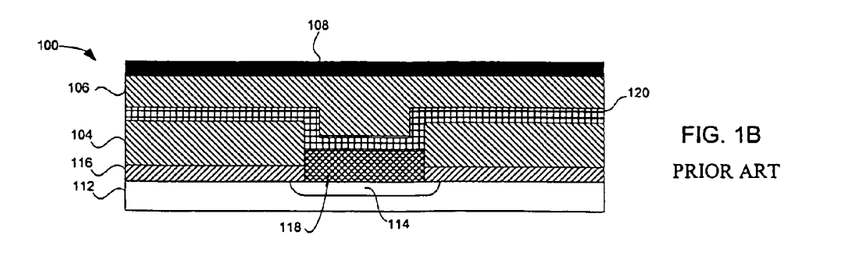
Figure 1C:
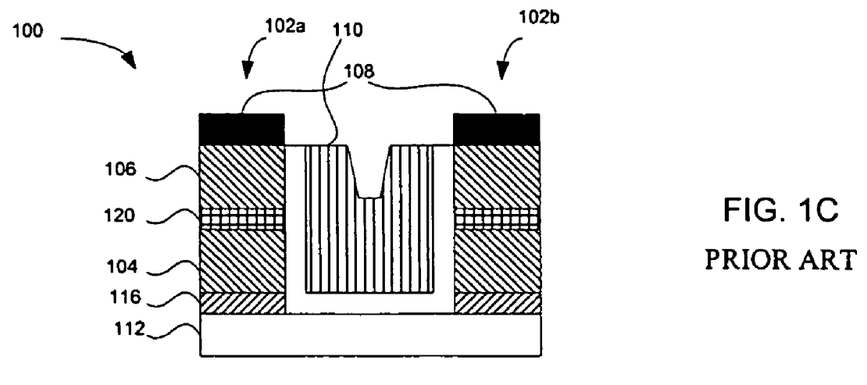

FIGS. 1A-1C illustrate a virtual ground (VG) erasable tunnel oxide (ETOX) flash memory cell array 100. FIG. 1A illustrates an overhead view of the flash memory cell array 100, FIG. 1B illustrates a view along a word line (i.e., the line 101a) of the flash memory cell array 100, and FIG. 1C illustrates a view across a two word lines of the flash memory cell array (i.e., the line 101b).

A VG ETOX flash memory cell array has the advantage of requiring a single contact for several cells (as many as 32 or more), rather than the one contact for every two cells required by a standard ETOX flash cell. The VG ETOX flash memory cell array 100 (see FIG. 1A) includes several gate stacks 102 (see FIG. 1C) that each defines an individual memory cell. The gate stacks 102 include two layers of polysilicon 104 and 106 (see FIGS. 1B and 1C) that define a floating gate and a control gate, respectively. In a VG ETOX flash memory cell array, adjacent gate stacks 102 (for example, the gate stacks 102a and 102b) are very close together, since there is no contact between the stacks 102. The distance between the gate stacks 102 may be as small as the lithography tools allow (for example, 45 nanometers). The close proximity of two gate stacks 102a and 102b can lead to cross-coupling between the gate stacks, and the inadvertent disturbance of adjacent memory cells.

Each gate stack 102 also has a layer of conductive silicide or metal 108 on top of the stack to create a low resistance control gate for the stack. A dielectric film 110 (see FIG. 1C) is typically deposited between two gate stacks 102a and 102b to prevent conduction of the region between the gate stacks 102a and 102b, thereby preventing shorts between two gate stacks 102a and 102b. The film 110 fills the cavity between the gate stacks 102a and 102b.

The gate stacks are formed using a multi-step process of growing, depositing, etching, etc., various semiconductor, dielectric, and conductive materials on a substrate 112 (see FIGS. 1B and 1C). The substrate 112 is a silicon substrate including several doped regions 114 (see FIG. 1B) that form source and drain regions. The several layers of the flash memory cell array 100 include a tunnel oxide layer 116, a self-aligned oxide 118 deposited over the doped regions 114, the floating gate comprising the first layer of polysilicon 104, an oxide-nitride-oxide (ONO) layer 120, the control gate comprising the second layer of polysilicon 106, and the silicide layer 108 (see FIGS. 1B and 1C). The flash memory cell array 100 further includes several source/drain (S/D) diffusions 122 and word lines 124 (see FIG. 1A).

As the size of flash memory cells is further reduced, the gap between the gate stacks 102 becomes smaller and smaller. A parasitic coupling on one floating gate may reprogram an adjacent floating gate, potentially resulting in data corruption or loss.

BRIEF DESCRIPTION OF THE DRAWINGS

One or more embodiments of the present invention are illustrated by way of example and not limitation in the figures of the accompanying drawings, in which like references indicate similar elements and in which.

DETAILED DESCRIPTION

Described herein is a Flash Memory Cell Having Reduced Floating Gate to Floating Gate Coupling. Note that in this description, references to "one embodiment" or "an embodiment" mean that the feature being referred to is included in at least one embodiment of the present invention. Further, separate references to "one embodiment" or "an embodiment" in this description do not necessarily refer to the same embodiment; however, such embodiments are also not mutually exclusive unless so stated, and except as will be readily apparent to those skilled in the art from the description. For example, a feature, structure, act, etc. described in one embodiment may also be included in other embodiments. Thus, the present invention can include a variety of combinations and/or integrations of the embodiments described herein.

According to an embodiment of the invention, a flash memory cell includes a first gate stack and a second gate stack having a film deposited across the gap between the first and second gate stacks so that the film creates a void between the first and second gate stacks. Dielectric materials may be used to reduce conductivity between the two stacks. A dielectric material that is resistant to conductivity has a low dielectric constant (k). The lowest-k dielectric material is air, which has a dielectric constant of approximately 1. By creating a void between the two gate stacks, the least conductive material (air) is left filling the space between the gate stacks, and the likelihood of parasitic coupling of two adjacent floating gates is substantially reduced.

Figure 2A:
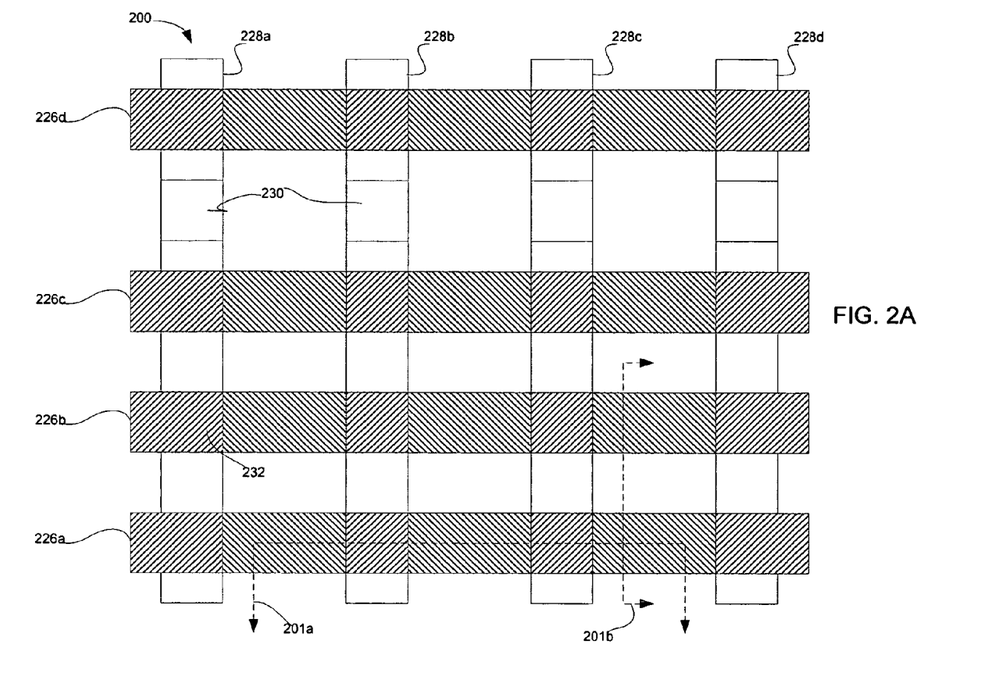
FIGS. 2A-2C illustrate a virtual ground (VG) erasable tunnel oxide (ETOX) flash cell array including a void between gate stacks to reduce cross-coupling between the gate stacks according to one embodiment of the invention.
Figure 2B:
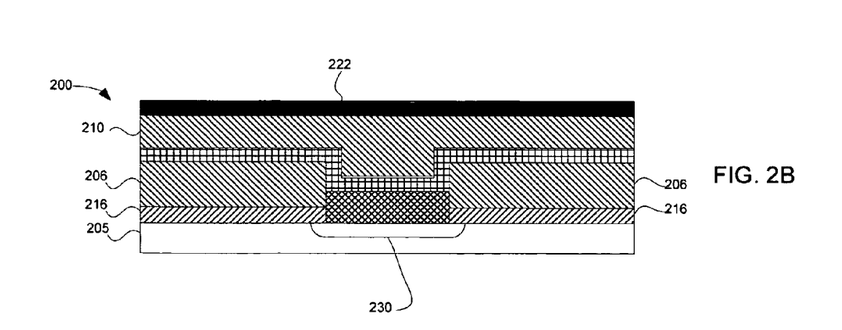
Figure 2C:
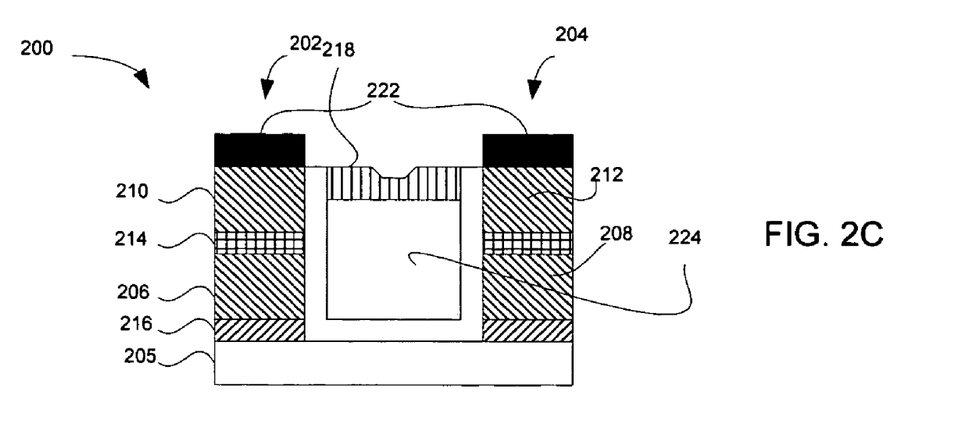

FIGS. 2A-2C illustrate a virtual ground (VG) erasable tunnel oxide (ETOX) flash cell array 200 including a void between gate stacks to reduce cross-coupling between the gate stacks. FIG. 2A is an overhead view of the VG ETOX flash memory cell array 200, FIG. 2B is a view along a word line of the flash memory cell array 200, and FIG. 2C is a view across word lines of the flash memory cell array 200. FIG. 2B illustrates a view along the line 201a in FIG. 2A, and FIG. 2C illustrates a view along the line 201b in FIG. 2A. Although the following description describes a VG ETOX flash memory cell array, it is understood that the embodiments of the invention described herein may also be used with a standard ETOX flash memory cell array or with other semiconductor devices.

The flash memory cell array 200 (see FIG. 2A) includes two gate stacks 202 and 204 (see FIG. 2C) formed on a silicon substrate 205. Each gate stack 202 and 204 includes a floating gate (206 and 208, respectively), and a control gate (210 and 212, respectively). The floating and control gates 206-212 are separated by an oxide-nitride-oxide (ONO) layer 214, and the floating gates 206 and 208 are separated from the substrate 205 by a tunnel oxide layer 216.

A film 218 (see FIG. 2C) is deposited across the gap between the gates 202 and 204. The film 218 may be any appropriate film, such as a silicon nitride (SiN) film, that does not form a silicide layer. The film 218 is deposited over the gate stacks 202 and 204 before the salicide layers 222 (see FIGS. 2B and 2C) are formed. The film 218 is reduced back to the tops of the gate stacks 202 and 204 using a chemical mechanical polishing (CMP) or other technique. The film 218 is deposited to prevent silicide from forming in the gap 224 between the gate stacks 202 and 204. The salicide 222 is a conductive material that couples to contact and vias for the stacks 202 and 204; if a silicide forms in the region between the gate stacks 202 and 204, the gate stacks 202 and 204 will short together. A dielectric layer 220 is also deposited over the gate stacks 202 and 204 to prevent shorting between the gate stacks 202 and 204.

The film 218 has a thickness sufficient so that when the film 218 is deposited, it bows across the gap between the gate stacks 202 and 204, forming a void 224. As mentioned above, the gate stacks 202 and 204 need to be able to operate independently. Since the size of flash cell arrays is becoming smaller, the likelihood of cross-coupling between the floating gates 206 and 208 of the two gate stacks 202 and 204 is greatly reduced.

The flash memory cell array 200 also includes several word lines 226, and alternating source or drain diffusions 228. The sources and drains comprise doped regions 230 of the substrate 205. A memory cell is programmed by issuing a charge down the appropriate word line 226 and diffusion/bitline 228. For example, to program the cell 232, a charge is propagated down the strap 228a and the word line 226b.

Figure 3:
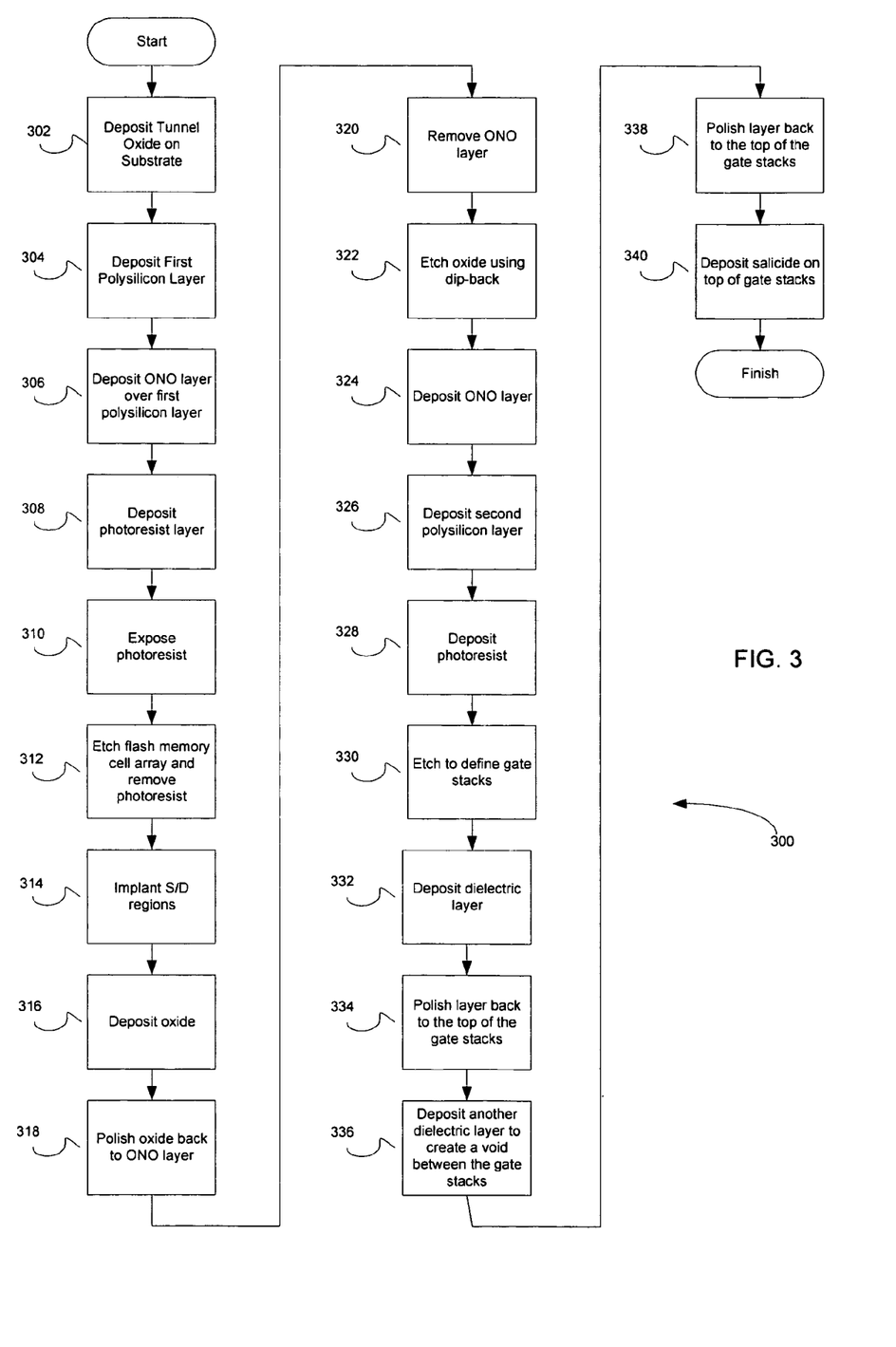
FIG. 3 is a flowchart describing a process for forming a flash memory cell array including air gaps between gate stacks.

FIG. 3 is a flowchart describing a process 300 for forming a flash memory cell array including air gaps between gate stacks. FIGS. 4A-4K and 5A-5F illustrate a flash memory cell array 400 formed using the process 300 described in FIG. 3. FIGS. 4A-4K show the memory cell array 400 along the word line 226, as in FIG. 2B. Figures show the memory cell array 400 across the word lines, as in FIG. 2C. The discussion of the process 300 and FIG. 3 below refers to elements of FIGS. 4A-4K and FIGS. 5A-5K.

Figure 4A:
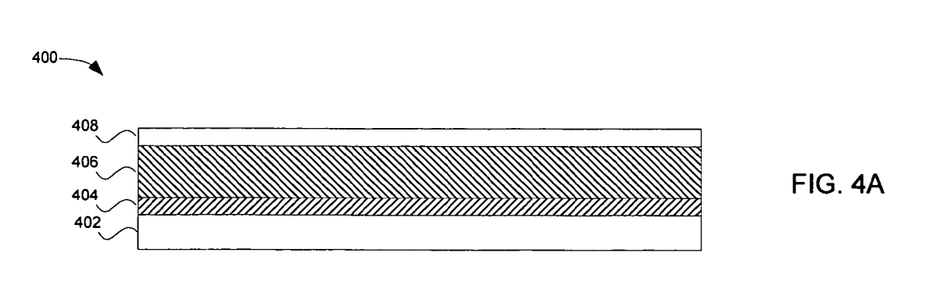
FIGS. 4A-4K show a memory cell array along a word line, as in FIG. 2B.

FIG. 4A illustrates a substrate 402 and several layers deposited on the substrate 402. In block 302, a tunnel oxide 404 is deposited on the substrate 402. The substrate 402 may be a single crystal silicon substrate. The tunnel oxide 404 may comprise silicon dioxide ($SiO_2$) or another appropriate material. The tunnel oxide 404 may be thermally grown by introducing oxygen to and heating the substrate 402. According to one embodiment, the tunnel oxide 404 is approximately 10 nanometers (nm) thick.

In block 304, a first polysilicon layer 406 is deposited over the substrate 402. The first polysilicon layer 406 will eventually form the floating gate of several memory cells. Polysilicon is a material typically used to form the gates of transistors in microelectronic devices. Polysilicon may also be deposited using CVD by introducing silane into the chamber. According to one embodiment, the first polysilicon layer 406 is approximately 500 nm thick.

A masking layer 408 is deposited over the first polysilicon layer 406 in block 306. According to one embodiment, the masking layer is approximately 130 nm thick and is an oxide-nitride-oxide (ONO) film that includes a silicon nitride (SiN) in between two $SiO_2$ layers which all may be deposited using CVD. The masking layer 408 serves two functions: it acts as a stopping layer for CMP when polishing back the self aligned oxide, and it acts as a mask during the ion implantation stage to ensure that the doped regions are only deposited in the region between the gate stacks.

Figure 4B:
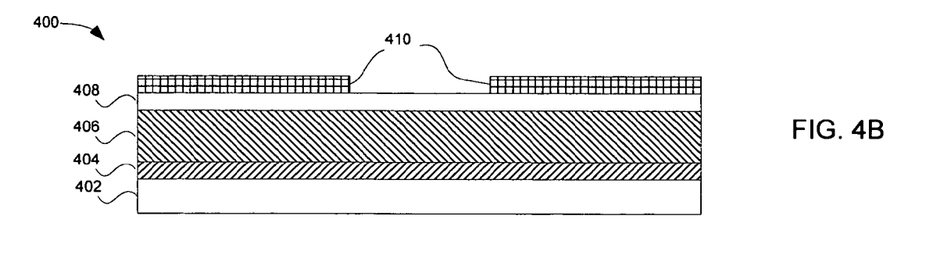

FIG. 4B illustrates the substrate 402 including a patterned photoresist layer 410. The stack of layers shown in FIG. 4A may be patterned using a process known as photolithography. First, in block 308, a layer of photoresist 410 is deposited over the cell array 400. Photoresist is sensitive to light, and becomes soluble when exposed to light. Photoresist is typically applied in liquid form using spin-on deposition. A mask that includes a pattern defining the areas underneath the photoresist layer 410 that are to be removed is created. Light is shone through the mask in block 310. The exposed regions are then developed, and the exposed photoresist is removed. In FIG. 4B, the remaining photoresist 410 is located to create floating gates as well as the source/drain (S/D) regions of the flash memory cell array 400.

Figure 4C:
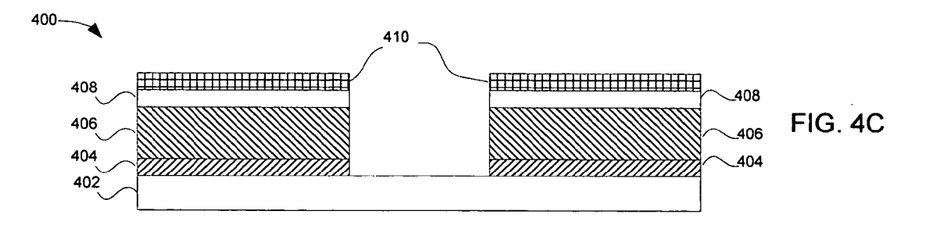

FIG. 4C illustrates the flash memory cell array 400 after being etched. In block 312, the array 400 is etched to remove the portions of the array 400 not covered by the photoresist 410. Etching typically includes introducing a chemical or plasma etching solution to the entire array 400. The etching solution is chosen so that is removes one material (e.g., any of the layers 404, 406, or 408) at a faster rate than another material (e.g., the photoresist layer 410). Several different etching solutions may be required to remove the different layers 404, 406, and 408. The array 400 may be etched using any standard chemical or plasma etchant, such as sulfur hexafluoride ($SF_6$), etc. The photoresist 410 is removed after etching.

Figure 4D:
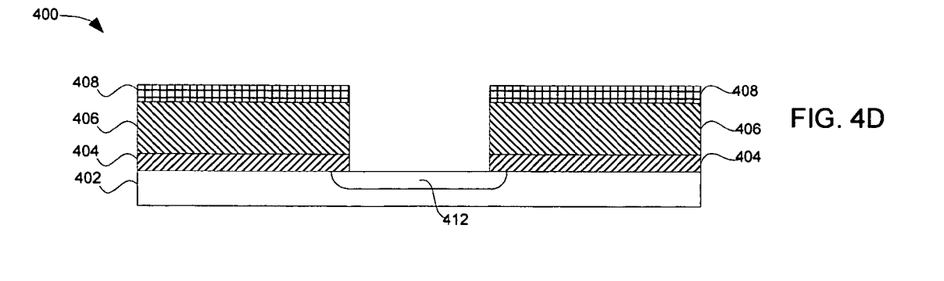

FIG. 4D illustrates source/drain (S/D) regions 412 of the flash memory cell array 400. In block 314, S/D regions 412 are selectively formed in the exposed portions of the substrate 402. The S/D regions 412 may be formed using ion implantation. Ion implantation typically involves bombarding the substrate 402 with high-energy ions to create impurities in the silicon of the substrate. The S/D regions 412, are, according to one embodiment, N+ type implants.

Figure 4E:
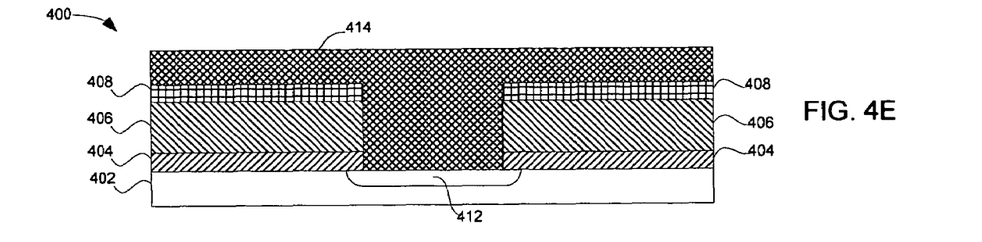
Figure 4F:
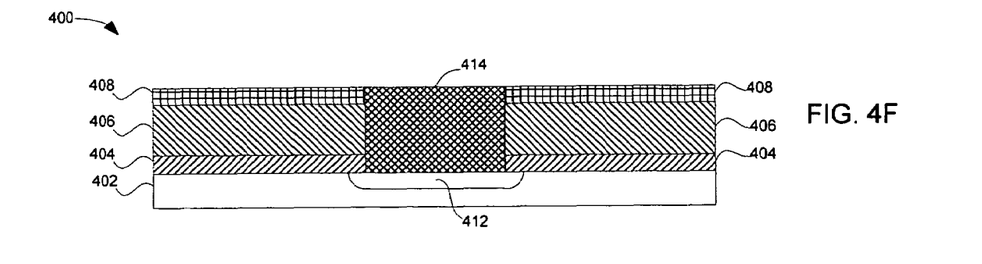

FIG. 4E illustrates an oxide 414 deposited over the memory cell array 400. The oxide 414 will form a self-aligned oxide (SAO) 416 on the S/D regions 412. The oxide is deposited over the array 400 in block 316 using CVD. In block 318, the oxide 400 is polished back to the masking layer 408. FIG. 4F illustrates a polished oxide 414. The oxide 414 may be polished using chemical mechanical polishing (CMP). CMP typically includes introducing a chemical slurry onto the structure to be polished, and polishing the structure using a rotating polishing platen. CMP planarizes the top of the flash memory cell array 400.

Figure 4G:
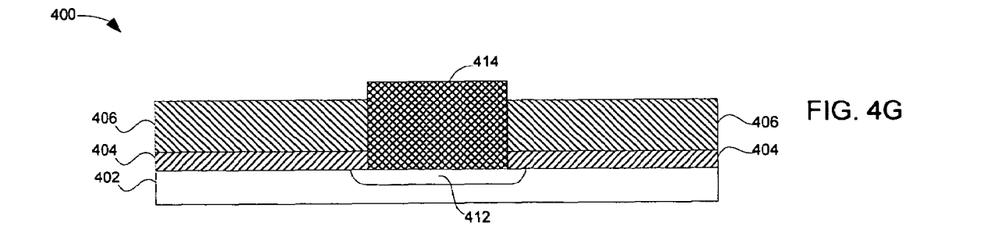
Figure 4H:
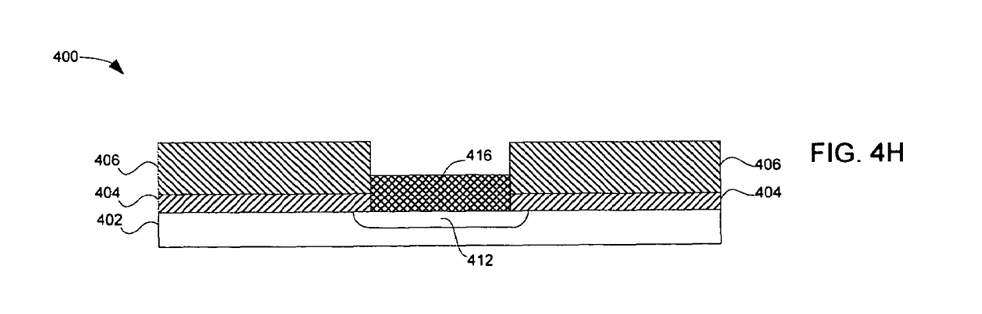

FIG. 4G illustrates the removal of the masking layer 408. In block 320, the ONO layer 408 is removed using an etching process or other appropriate procedure. FIG. 4H illustrates the creation of the SAO 416. In block 322, the oxide 414 is etched using a dip-back solution. The array 400 is submerged into an appropriate etching solution to remove a portion of the oxide 414. The array 400 is left in the etching solution for a period of time appropriate to reduce the oxide 414 to the desired size of the SAO 416.

Figure 4I:
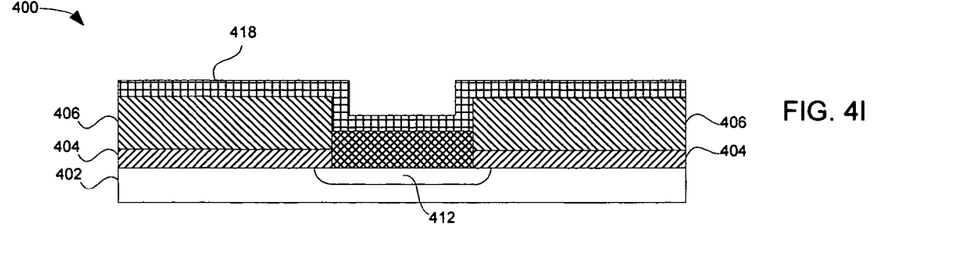
Figure 4J:
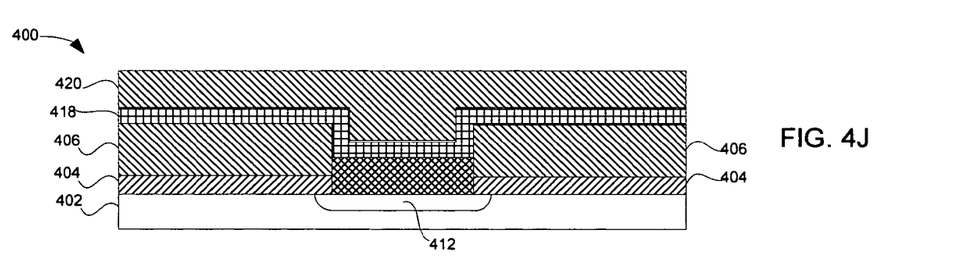

In block 324, another ONO layer 418 is deposited over the array 400. FIG. 4I illustrates the ONO layer 418. In block 326, a second polysilicon layer 420 is deposited over the array 400. The ONO layer 418 and the second polysilicon layer 420 may be deposited using CVD, as described above. FIG. 4J illustrates the second polysilicon layer 420. The second polysilicon layer will eventually form the control gates of the flash memory cell array 400.

Figure 5A:
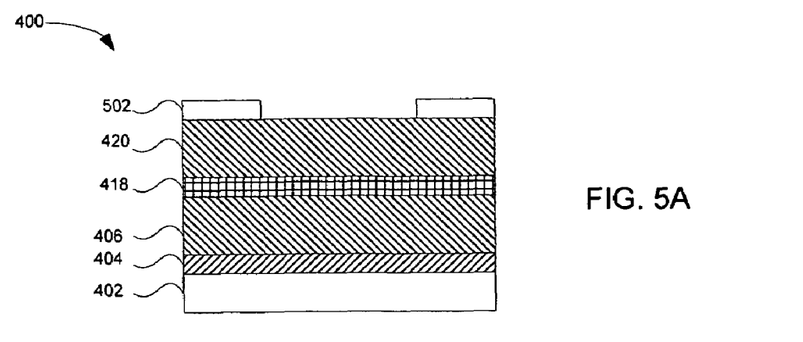
FIGS. 5A-5F show a memory cell array across word lines, as in FIG. 2C.

The word lines of the memory array 400 are created in blocks 328-334. In block 328, a photoresist layer 502 is deposited over the array 400. FIG. 5A illustrates the photoresist layer 502 across the word line. The photoresist layer has been deposited, exposed, and developed (as described above), using a mask to expose the areas of the various layers that are removed to define the word lines.

Figure 5B:
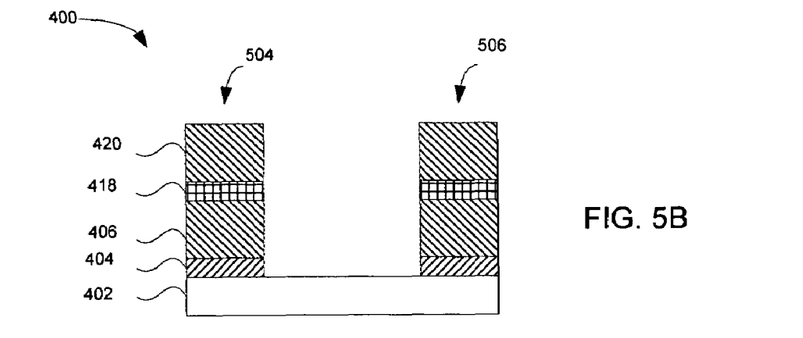
Figure 5C:
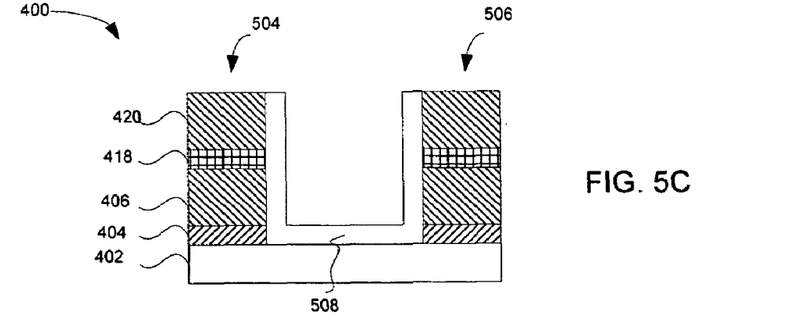

In block 330, the memory array 400 is etched, using an appropriate etch technology, such as a wet or plasma etch, to define the gate stacks 504 and 506. FIG. 5B illustrates the gate stacks 504 and 506. In block 332, an SiN or other dielectric layer 508 is deposited over the array 400. The layer 508 is a dielectric layer to prevent coupling between the gate stacks 504 and 506, and further comprise a material that does not form a silicide. In block 334, the layer 508 is polished back to the top of the gate stacks 504 and 506 using a CMP or other planarizing procedure, so that none of the layer 508 remains atop the gate stacks 504 and 506. FIG. 5C illustrates the deposited layer 508.

Figure 5D:
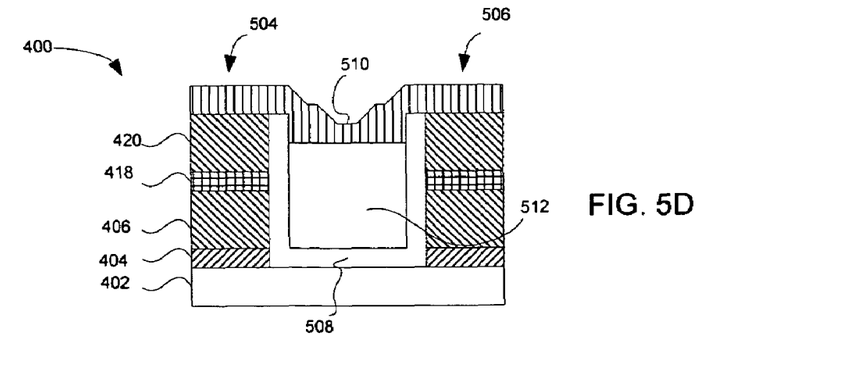

Blocks 336-340 of the process 300 describe forming a void between the gate stacks 504 and 506. In block 336, an SiN or other layer 510 is deposited over the gate stacks 504 and 506. The layer 510 is deposited using a film deposition procedure. According to one embodiment, the layer 510 does not form a silicide. Since a salicide layer is a conductive material used to form an interface for contacts and vias on top of the gate stacks 504 and 506, no silicide should be formed on the layer 508 between the gate stacks 504 and 506 to prevent shorting between the gate stacks 504 and 506. FIG. 5D illustrates a deposited layer 510.

The layer 510 should be thick enough so that it does not fall into and fill in the void 512 when it is deposited. The layer 510 should be a material that does not form a silicide, such as any material that is not silicon or polysilicon. In order to make the layer 510 bridge the gap between the gate stacks 504 and 506, the deposition conditions should be controlled. One way to control the deposition condition is to examine the aspect ratio and profile of the gate stacks 504 and 506. The thickness of the film 510 can be increased to bow the film 510.

According to one embodiment, the gate stacks 504 and 506 may have a total height of 2430 Angstroms (for example, if the first polysilicon layer 406 is 500 Angstroms thick, the ONO layer 418 is 130 Angstroms thick, and the second polysilicon layer 420 is 1800 Angstroms thick). The width of the gap between the gate stacks 504 and 506 depends on the resolution of the lithography equipment used. For example, there may be a gap of 65 nanometers (650 Angstroms) between the stacks 504 and 506. The aspect ratio (AR) of the gate stacks is the ratio between their height and the gap between the two stacks. The AR can be used to determine the appropriate thickness of the film 510, because a higher AR may require a thicker film 510 to prevent the film from filling the gap between the stacks 504 and 506. Using this example, 65 nm lithography equipment would give an AR of 4:1, while 45 nm lithography equipment would give an AR of 6:1. A typical AR value might range from 3:1 to 8:1. Using a 3:1 AR as an example, a 700 nm SiN film deposited over the gate stacks 504 and 506 would bow and produce the void 512. Other dielectric materials may require different thicknesses.

Figure 4K:
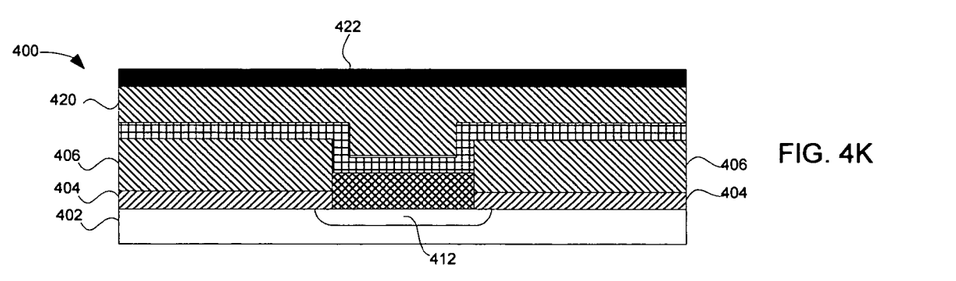
Figure 5E:
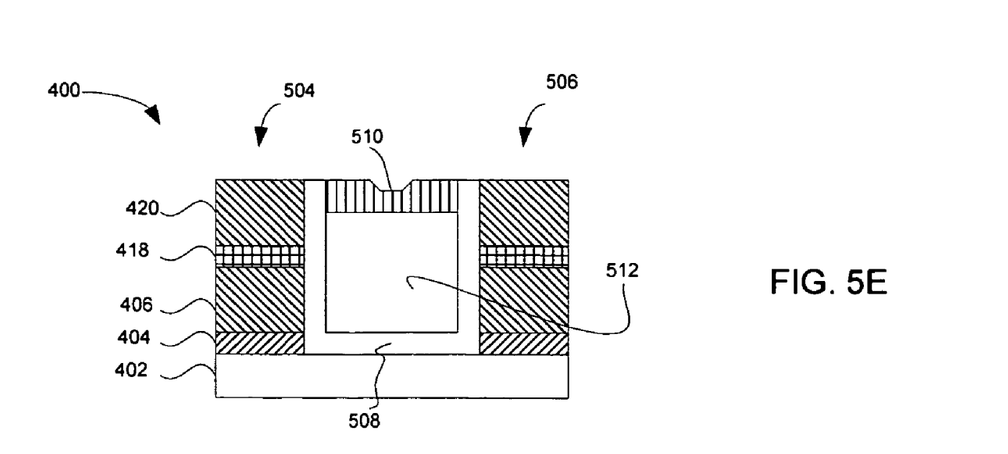
Figure 5F:
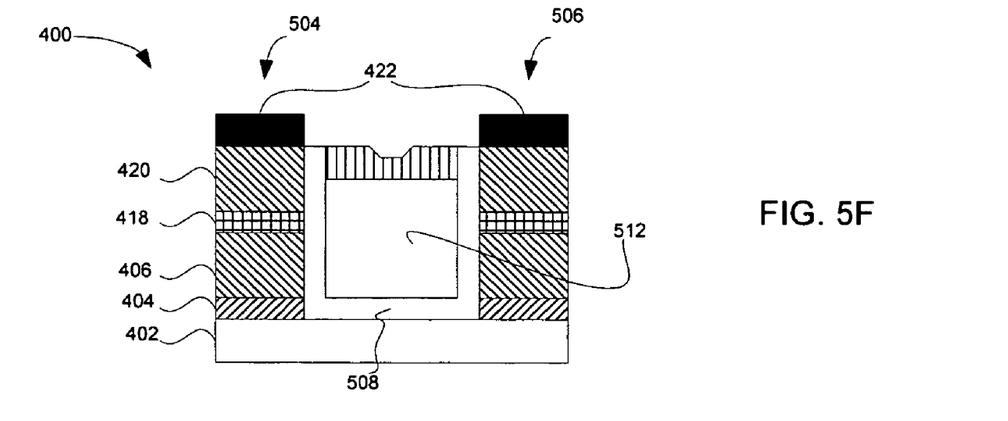

In block 338, the layer 508 is polished back to the top of the gate stacks 504 and 508. The layer 508 may be polished using CMP or another appropriate technique. FIG. 5E illustrates the layer 510 polished back to the top of the gate stacks 504 and 506. In block 340, a salicide (i.e., a self-aligned silicide) is formed on the top of the gate stacks 504 and 506 to create a contact for the gate stacks 504 and 506. FIGS. 4K and 5F illustrate a salicide 422 on the gate stacks 504 and 506. The salicide 422 is a self-aligned silicide. A silicide is formed when a metal or alloy is deposited on the array 400, which is then heated to approximately 600 to 1000° Celsius. The metal or alloy used may comprise any appropriate material such as cobalt, nickel, tantalum, etc. The salicide 422 is "self-aligned" since it will only form on the second polysilicon layer 420, and not on the layer 510, thereby aligning itself to the desired region (the top of the gate stacks 504 and 506). The salicide 422 forms contacts on the gates 504 and 506, allowing communication with the gates in the gate stacks 504 and 506.

A low-k dielectric conducts less electricity than a high-k dielectric. Air, which fills the void 512, has a dielectric constant of approximately 1, compared to SiN, which has a dielectric constant of approximately 7. Therefore, filling the void 512 with air, rather than with SiN, greatly reduces the chance of a charge on one floating gate inadvertently reprogramming an adjacent floating gate. This improves the reliability and performance of the flash memory cell array 400 without increasing its cost. As lithography improves and the distances between the gate stacks of VG ETOX (and other flash memories) is reduced, the likelihood of floating gate-floating gate coupling increases. The embodiments of the invention described herein can be used to reduce the occurrence of this coupling.

Several of the embodiments of this invention have been described using specific semiconductor processing techniques and specific semiconductor structures. It is understood that any appropriate structure or technique may be substituted in place of those described herein. For example, physical vapor deposition (PVD) or atomic layer deposition (ALD) or thermal oxidation may be used in place of CVD. Further, although the embodiments describe a VG ETOX flash memory cell array, the embodiments of the invention may also be used with a standard ETOX flash memory cell array or any other semiconductor structure where they may be appropriate.

This invention has been described with reference to specific exemplary embodiments thereof. It will, however, be evident to persons having the benefit of this disclosure that various modifications and changes may be made to these embodiments without departing from the broader spirit and scope of the invention. The specification and drawings are accordingly to be regarded in an illustrative rather than in a restrictive sense.

The invention claimed is:

1. A method for forming a flash memory cell, comprising:
   building a first gate stack and a second gate stack on a substrate;
   depositing a film over and between the first gate stack and the second gate stack so as to form a void beneath the film and between the first gate stack and the second gate stack, wherein depositing the film comprises:
   determining a thickness of the film based on an aspect ratio of the first and second gate stacks; and
   depositing a film having the thickness, wherein the thickness is between 500 and 700 Angstroms and wherein the aspect ratio is between 3:1 and 6:1; and
   polishing the film to a top of the first and second gate stacks.

2. The method of claim 1, further comprising:
   forming a salicide on the first and second gate stacks.

3. The method of claim 2, wherein building a first gate stack and a second gate stack comprises:
   growing a tunnel oxide on the substrate;
   growing a first polysilicon layer over the tunnel oxide;
   depositing a first oxide-nitrogen-oxide (ONO) layer over the first polysilicon layer;
   etching the substrate to define the first and second gate stacks;
   depositing a self aligned oxide (SAO) over the first ONO layer;
   depositing a second ONO layer over the SAO;
   growing a second polysilicon layer over the SAO; and
   etching the second polysilicon layer.

4. The method of claim 1, wherein depositing a film comprises:
   depositing a nitride layer.

5. The method of claim 1, wherein depositing a film comprises:
   depositing a carbon-doped film.

6. The method of claim 1, wherein the flash memory cell is a virtual ground (VG) flash memory cell.

7. A method for assembling a flash memory cell comprising:
   forming a first gate stack on a substrate;
   forming a second gate stack adjacent the first gate stack on the substrate;
   determining an aspect ratio of the first gate stack and the second gate stack;
   selecting a film layer having a thickness sufficient to create a void between the first and second gate stacks when the film layer is deposited over the first and second gate stacks based on the aspect ratio, wherein the aspect ratio is between 3:1 and 8:1;
   depositing the film layer over the first gate stack and the second gate stack to define the void between the first gate stack and the second gate stack; and
   polishing the film layer back to a top of the first and second gate stacks.

8. The method of claim 7, further comprising depositing a dielectric layer in a gap between the first and second gate stacks.

9. The method of claim 8, further comprising forming a salicide on the top of the first and second gate stacks.

10. The method of claim 7, wherein the flash memory cell is a virtual ground erasable tunnel oxide (VG ETOX) flash memory cell.

* * * * *